(12) United States Patent
Green

(10) Patent No.: US 9,036,762 B2
(45) Date of Patent: May 19, 2015

(54) GENERATING COMPATIBLE CLOCKING SIGNALS

(71) Applicant: Silicon Laboratories Inc., Austin, TX (US)

(72) Inventor: Brian D. Green, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 115 days.

(21) Appl. No.: 13/864,203

(22) Filed: Apr. 16, 2013

(65) Prior Publication Data

US 2014/0307842 A1    Oct. 16, 2014

(51) Int. Cl.
*H03D 3/24*        (2006.01)
*H04L 7/033*        (2006.01)

(52) U.S. Cl.
CPC ........... *H04L 7/0331* (2013.01); *H03L 2207/50* (2013.01)

(58) Field of Classification Search
CPC ....... H03L 7/091; H03L 2207/50; H03L 7/06; H03L 7/0331
USPC ................................................ 375/354, 375
See application file for complete search history.

(56) References Cited

U.S. PATENT DOCUMENTS

| | | | | |
|---|---|---|---|---|
| 4,891,824 A | * | 1/1990 | Takamura et al. ............. | 375/351 |
| 6,181,212 B1 | * | 1/2001 | Khoini-Poorfard et al. ..... | 331/16 |
| 6,211,747 B1 | * | 4/2001 | Trichet et al. ................. | 332/128 |
| 6,337,682 B1 | * | 1/2002 | Hwang .......................... | 345/213 |
| 7,499,044 B2 | * | 3/2009 | Kennedy et al. .............. | 345/213 |
| 7,587,131 B1 | * | 9/2009 | Melanson et al. ............. | 386/204 |
| 2005/0058158 A1 | * | 3/2005 | Miyamoto .................... | 370/503 |
| 2013/0069696 A1 | | 3/2013 | Koerner | |

FOREIGN PATENT DOCUMENTS

| EP | 1693967 | 8/2006 |
|---|---|---|
| EP | 2584706 | 4/2013 |

* cited by examiner

*Primary Examiner* — Vineeta Panwalkar
(74) *Attorney, Agent, or Firm* — Meyertons, Hood, Kivlin, Kowert & Goetzel, P.C.

(57) ABSTRACT

Techniques are disclosed relating to generating compatible clock signals. In one embodiment, an apparatus is configured to receive an input clock signal and a reference clock signal. In this embodiment, the apparatus includes a rate estimation unit and a phase-locked loop (PLL) unit. In this embodiment, the PLL unit is configured to generate, using a control signal from the rate estimation unit and the input clock signal, a PLL output clock signal. In this embodiment, the rate estimation unit is configured to adjust the control signal such that the PLL output clock signal and the reference clock signal are compatible. In this embodiment, the rate estimation unit is configured to adjust the control signal based on the reference clock signal and a comparison clock signal generated by the apparatus based on the PLL output clock signal.

21 Claims, 4 Drawing Sheets

GENERATING COMPATIBLE CLOCKING SIGNALS

BACKGROUND

Processing systems for sampled data typically operate on multiple data streams derived from different time bases. For example, digital signal processors (DSP's) may receive multiple analog and/or digital audio inputs and may output multiple audio signals, all of which may be produced or received at different rates. In order to process the data streams, the different time bases may need to be reconciled. Digital asynchronous sample rate converters (ASRC's) often perform such reconciliation. However, ASRC's are costly in terms of computation resources and hardware, especially in high-performance applications.

SUMMARY

Techniques are disclosed relating to generating compatible clock signals. Compatible clock signals may allow reduction or elimination of asynchronous sample rate converters for reconciling different time bases.

In one embodiment, an apparatus is configured to receive an input clock signal and a reference clock signal. In this embodiment, the apparatus includes a rate estimation unit and a phase-locked loop (PLL) unit. In this embodiment, the PLL unit is configured to generate, using a control signal from the rate estimation unit and the input clock signal, a PLL output clock signal. In this embodiment, the rate estimation unit is configured to adjust the control signal such that the PLL output clock signal and the reference clock signal are compatible. In this embodiment, the rate estimation unit is configured to adjust the control signal based on the reference clock signal and a comparison clock signal generated by the apparatus based on the PLL output clock signal. The PLL unit may include a fractional-N PLL and the control signal may be a divide ratio control signal.

In one embodiment, the apparatus is configured to maintain a current PLL divide ratio in response to detecting a removal of the reference clock signal. The reference signal may be an audio sampling signal. A crystal oscillator may generate the input clock signal. The apparatus may further include a delta-sigma modulator configured to modulate the control signal.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

As used herein, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112(f) for that unit/circuit/component.

DETAILED DESCRIPTION

Figure 1:
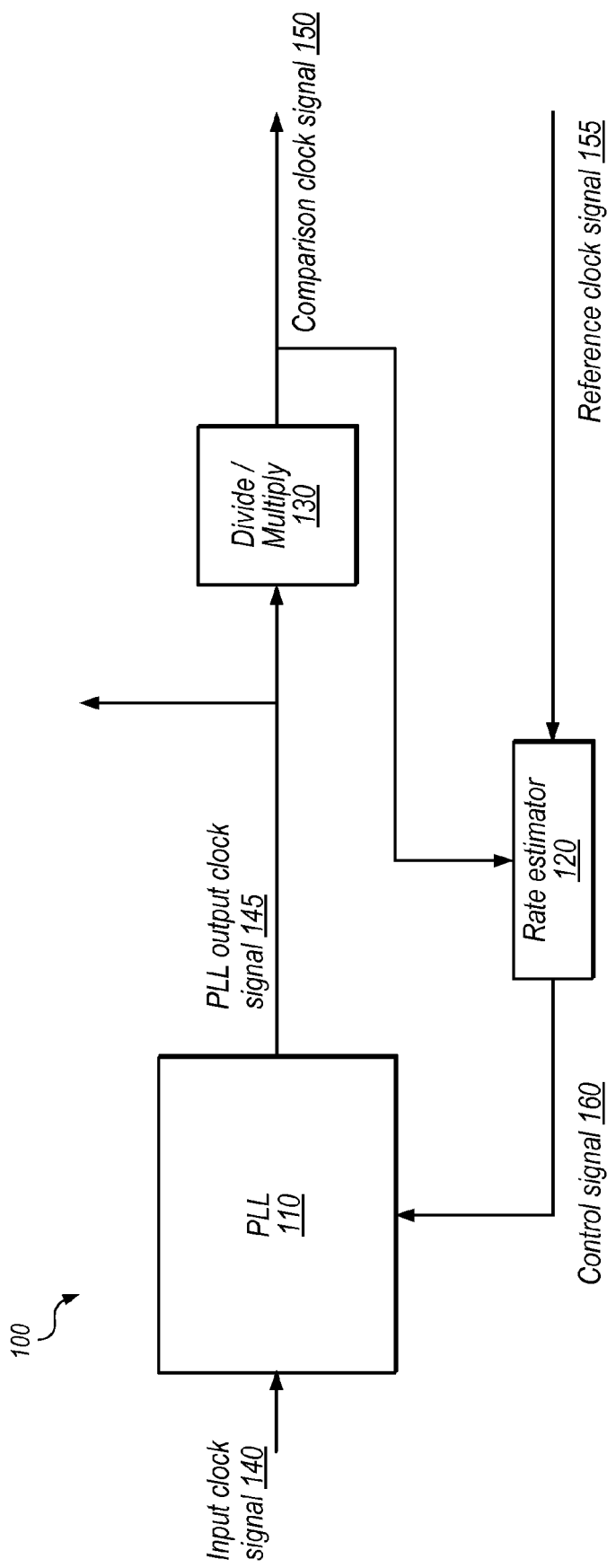
FIG. 1 is a block diagram illustrating one embodiment of an apparatus for generating clock signals.

Referring to FIG. 1, a block diagram illustrating one embodiment of a system 100 for generating clock signals is shown. In the illustrated embodiment, system 100 includes phase-locked loop (PLL) unit 110, rate estimator 120, and divide/multiply unit 130. In the illustrated embodiment, rate estimator 120 is configured to adjust a divide ratio of PLL unit 110 such that PLL output clock signal 145 and reference clock signal 155 are compatible clock signals. System 100 may efficiently reconcile different time bases without requiring an asynchronous sample rate converter.

As used herein, the term "compatible" refers to clock signals with frequencies that are rational multiples of each other. Thus, a first clock signal with a frequency F1 is compatible with a second clock signal with a frequency F2 when F2 matches $$\frac{m}{n} \times F1$$

where m and n are both positive integers.

Further, as used herein, the term "directly compatible" refers to clock signals where a first clock signal has a clock frequency that is an integer multiple of a frequency of a second clock signal. Thus, a first clock signal with a frequency F1 is directly compatible with a second clock signal with a frequency F2 when F2 matches n×F1 or $$\frac{1}{n} \times F1$$

(where n is a positive integer). In the example above, where "compatible" signals have a frequency ratio of $$\frac{m}{n},$$

the signals are directly compatible when m or n is 1.

Further, as used herein, the term "incompatible" refers to clock signals with frequencies that are not rational multiples of each other. For example, a first clock signal with a frequency F1 is incompatible with a second clock signal with a frequency F2 that matches π times F1, because π is irrational and cannot be expressed as a ratio of two integers.

Further, as used herein, the terms "clock" and "clock signal" refer to a periodic signal, e.g., as in a two-valued (binary) electrical signal. Depending on the precision with which two clock signals are measured, it may be practically impossible for two clock signals to be exactly compatible or to have exactly matching frequencies. For example, a person skilled in the art will readily understand that clock waveforms described as having the same frequency will not look identical to each other or have exactly matching frequencies at all times. Thus, any references to compatible clock signals refer to clocks that are nominally compatible within an acceptable range over a given period of time. Similarly, any references to clock signals with matching frequencies refer to the clocks have nominally matching frequencies within an acceptable range over a given period of time.

In the illustrated embodiment, PLL 110 is configured to receive input clock signal 140 and control signal 160 and to generate PLL output clock signal 145. In one embodiment, PLL unit 110 is configured to generate PLL output clock signal 145 with a frequency that is a multiple of input clock signal 140, where the multiple is determined by control signal 160. The multiple may be an integer multiple or a fractional multiple. A fractional multiple may provide greater precision control for PLL output clock signal 145. PLL's are well known in the art and PLL unit 110 may include any of various appropriate PLL implementations. PLL unit 110 may be implemented by any appropriate circuit, processing element, and/or software module. In one embodiment, PLL unit 110 is a fractional-N PLL. A crystal oscillator or any other appropriate clock generator may generate input clock signal 140. Various circuit elements (not shown) may operate using PLL output clock signal 145 as a reference and may also divide PLL output clock signal 145 before use using various appropriate ratios. In some embodiments, PLL output clock signal is compatible with reference clock signal 155.

Divide/multiply unit 130 may be configured to divide and/or multiply the frequency of PLL output clock signal 145 in order to generate comparison clock signal 150. In some embodiments, divide/multiply unit 130 is a variable divider. In other embodiments, divide/multiply unit 130 is another PLL unit, such as an M/N integer PLL, for example. Comparison clock signal 150 and reference clock signal 155 may have matching clock frequencies during operation of system 100. In other implementations, comparison clock signal 150 and reference clock signal 155 do not have matching frequencies during operation of system 100, but are directly compatible. In these implementations, rate estimator 120 is configured to take the ratio between frequencies of comparison clock signal 150 and reference clock signal 155 into account when determining control signal 160.

In the illustrated embodiment, rate estimator 120 is configured to compare the frequencies of comparison clock signal 150 and reference clock signal 155 and adjust a divide ratio of PLL unit 110 using control signal 160. In one embodiment, rate estimator 120 is implemented in firmware. In other embodiments, rate estimator 120 may be implemented using any appropriate circuit, software module, and/or processing element. In various embodiments, rate estimator 120 is configured to adjust control signal 160 such that comparison clock signal 150 and reference clock signal 155 have the same frequency or are directly compatible, closing the feedback loop. As a result of this adjustment, in some embodiments, PLL output clock signal 145 and reference clock signal 155 will become compatible signals after an initial warm-up period. In some embodiments, system 100 may be configured such that PLL output clock signal 145 and reference clock signal 155 become directly compatible (e.g., when divide/multiply unit 130 is an integer divider). Although it is referred to as a "comparison" signal, comparison clock signal 150 may be provided to other units of system 100 for various clocking purposes in addition to being provided to rate estimator 120 for comparison with reference clock signal 155.

In some embodiments, system 100 is configured to continue generating PLL output clock signal 145 using a particular divide ratio in response to removal of reference clock signal 155. In one embodiment, rate estimator 120 is configured to maintain or "freeze" control signal 160 at a current value (i.e., a value of control signal 160 at a point in time when reference clock signal 155 was removed) in order to maintain a current divide ratio for PLL 110. Rate estimator 120 may be configured to resume adjusting control signal 160 in response to detecting the presence of reference clock signal 155. This may allow PLL output clock signal 145 to be robust against transient drop-outs of reference clock signal 155.

Figure 2:
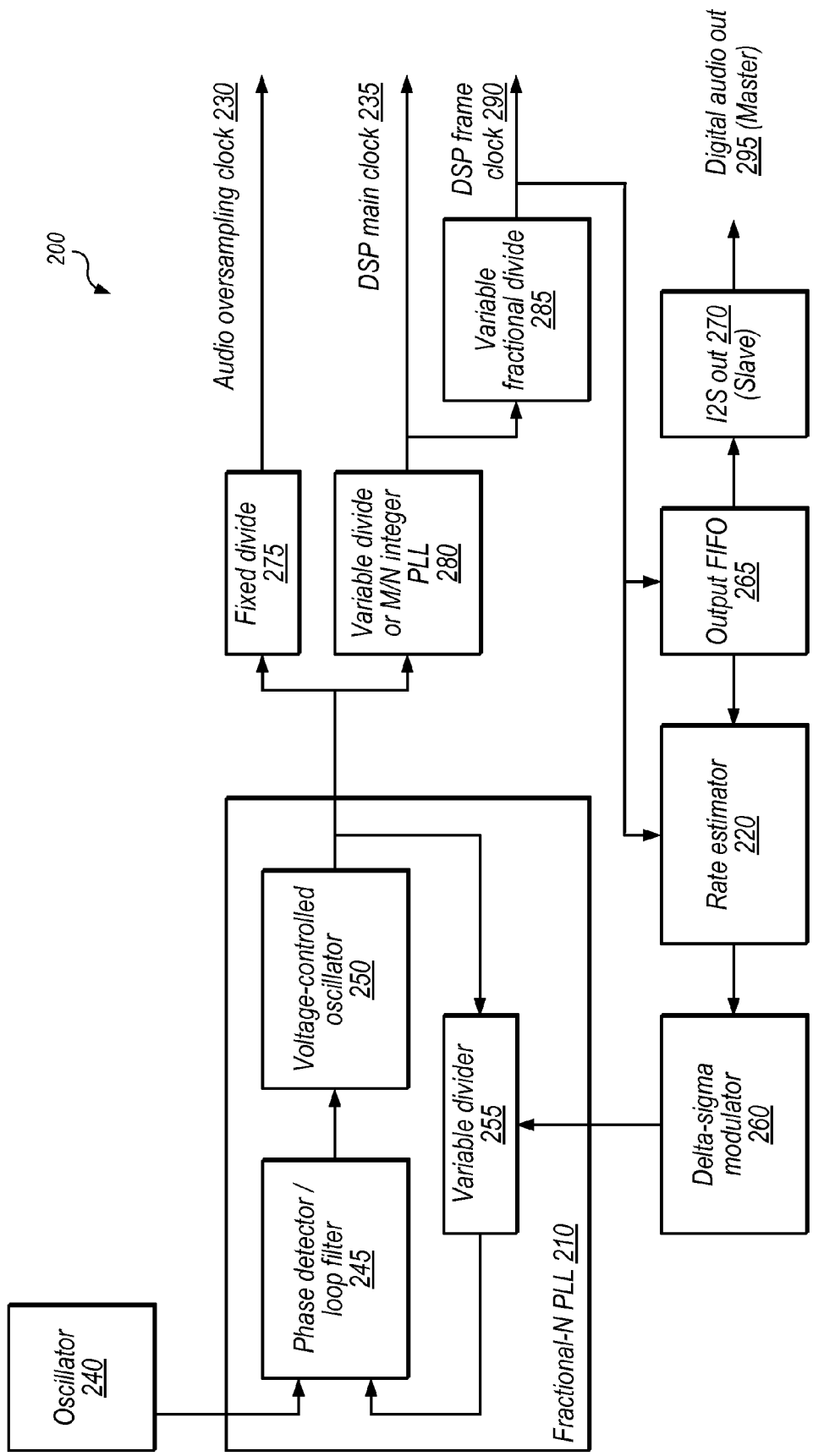
FIG. 2 is a block diagram illustrating a more detailed exemplary embodiment of an apparatus for generating clock signals.

Referring now to FIG. 2, a block diagram illustrating a more detailed exemplary embodiment of a system 200 for generating clock signals is shown. In the illustrated embodiment, system 200 includes fractional-N PLL 210, oscillator 240, delta-sigma modulator (DSM) 260, rate estimator 220, output FIFO 265, I2S out unit 270, fixed divide unit 275, variable divide or M/N integer PLL (VD) 280, and variable fractional divide 285. In one embodiment, system 200 is configured to generate audio sampling clock 230 and DSP main clock 235 which are each compatible with digital audio out 295 and to generate DSP frame clock 290 at the sampling frequency of digital audio out 295 (or some integer multiple thereof).

In the illustrated embodiment, PLL 210 includes phase detector/loop filter (PDLF) 245, voltage-controlled oscillator (VCO) 250, and variable divider 255. In the illustrated embodiment, PDLF 245 is configured to receive a clock signal from oscillator 240 and compare it with the output of variable divider 255. In this embodiment, PDLF 245 is configured to filter (e.g., integrate) any difference in the phase of the two input signals and use the result to control the frequency of VCO 250. VCO 250 may be a ring oscillator, for example. In the illustrated embodiment, the output of VCO is output from PLL 210 and fed back to variable divider 255 in order to close the loop (the "inner loop" of system 200). In the illustrated embodiment, the divide ratio of variable divider 255 is adjustable in order to change the output frequency of PLL 210.

Variable divider 255 may be designed according to any of various divider implementations as appropriate based on the design of fractional-N PLL 210. As one example, variable divider 255 may include two counters A and B and may be configured to switch between dividing by an integer N and an integer N+1 based on the counters in order to divide by a fractional amount over a period of time. In this example, the number N may be adjustable based on the output of DSM 260.

In the illustrated embodiment, the output of PLL 210 is provided to fixed divide unit 275 to generate audio oversampling clock 230. Audio oversampling clock 230 may be used for various sampling purposes. Oversampling may facilitate anti-aliasing, reduce noise, and may be implemented in digital to analog converters (DAC's) and/or analog to digital converters (ADC's) in order to improve resolution. In some embodiments, multiple audio oversampling clocks may be generated using multiple different fixed divide ratios. In other embodiments, the output of PLL 210 may be provided to various other elements not shown in FIG. 2.

In the illustrated embodiment, the output of PLL 210 is also provided to VD 280 to generate DSP main clock 235. DSP main clock 235 may control timing of various DSP operations. In one embodiment, unit 280 is a variable divider. In another embodiment, unit 280 is an M/N integer PLL, which may provide useful control for preventing radio frequency (RF) interference in a DSP.

In the illustrated embodiment, DSP main clock 235 is in turn divided by variable fractional divide 285 to generate DSP frame clock 290. In the illustrated embodiment, system 200 is configured to generate DSP frame clock 290 at a frequency that is directly compatible with the frequency at which I2S out unit 270 reads digital audio samples from output FIFO 265 (e.g., in order to insert samples into FIFO 265 at the same rate at which I2S out unit 270 removes the samples). In the illustrated embodiment, digital audio out signal 295 is the master in the I2S protocol and controls the clock speed of I2S communications. In other embodiments, any of various other external sampling clocks and protocols may be implemented. DSP frame clock 290 may correspond to the comparison clock signal 150 of FIG. 1, in some embodiments.

In the illustrated embodiment, rate estimator 220 is configured to compare the rates of DSP frame clock 290 and I2S out unit 270 by determining the relative positions of an insert pointer and a remove pointer for output FIFO 265 over time. For example, in a situation in which the insert pointer is advancing more rapidly that the remove pointer, rate estimator 220 may determine that DSP frame clock 290 is providing audio samples faster than I2S out unit 270 is reading them. Based on the pointers, in the illustrated embodiment, rate estimator 220 is configured to generate a control signal and send it to DSM 260. As described above, the divide ratio of variable divider 255 depends on the output of DSM 260, closing the "outer loop" of system 200 and adjusting the frequency of DSP frame clock 290. In other embodiments, output FIFO 265 may be any appropriate storage element. In yet other embodiments, rate estimator 220 may compare clock signal frequencies directly rather than comparing clock signals based on pointers for a storage element.

In the illustrated embodiment, DSM 260 is configured to modulate the control signal from rate estimator 220. In other embodiments, any of various appropriate types of modulators (or no modulator at all) may be implemented. DSM 260 is included simply to illustrate one appropriate type of modulator.

In some embodiments, DSP frame clock 290 may be directly compatible with I2S out unit 270, but may not operate at the same frequency. For example, DSP frame clock may operate at a fourth of the frequency of I2S out unit 270, but may deposit four samples in output FIFO 265 every clock cycle. In these embodiments, rate estimator 220 may be configured to take the ratio between frequencies into account when comparing frequencies and generating a control signal. In other embodiments, system 200 is configured such that DSP frame clock 290 and I2S out unit 270 have the same nominal frequency.

DSP main clock 235 should generally be fast enough to support a particular peak computation burden on a DSP. However, DSP main clock 235 may sometimes run at a lower frequency in order to reduce power consumption. For example, a clock management unit (not shown) may be configured to adjust the divide ratio of VD 280 in order to adjust the frequency of DSP main clock 235. In this embodiment, the clock management unit is also configured to adjust variable fractional divide 285 to maintain the DSP frame clock 290 at a directly compatible frequency with I2S out 270 and avoid disturbing the PLL output frequency.

Figure 3:
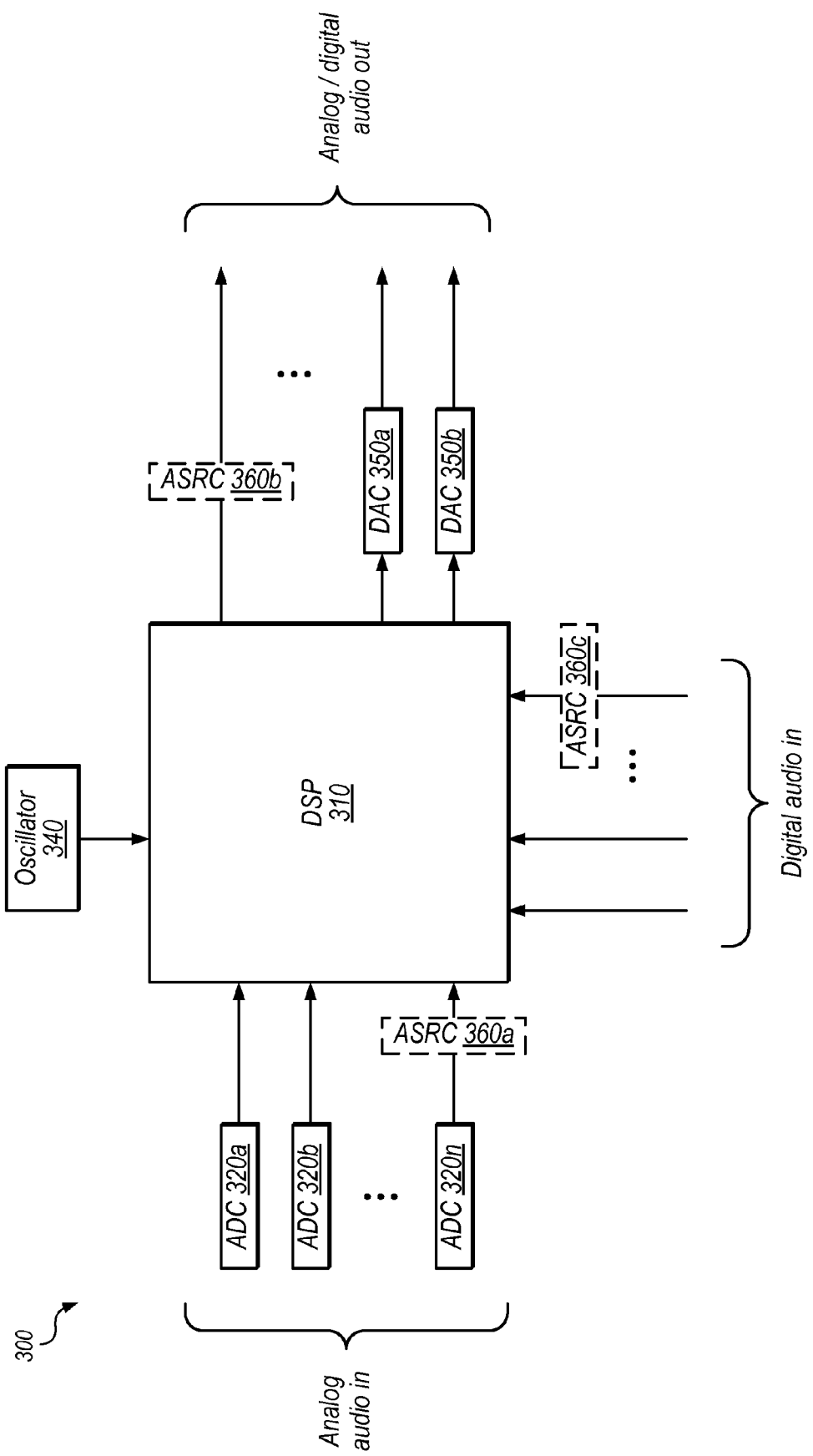
FIG. 3 is a block diagram illustrating one embodiment of a system that includes a digital signal processor.

Referring now to FIG. 3, one exemplary embodiment of a system 300 that includes a DSP is shown. In the illustrated embodiment, DSP 310 is configured to receive input from oscillator 340, multiple analog audio sources, and multiple digital audio sources. In the illustrated embodiment, DSP 310 is also configured to generate multiple analog and/or digital audio output signals. In other embodiments, clocks may be generated for various purposes other than, or in addition to, audio sampling. The embodiments of FIGS. 2 and 3 include audio sampling elements in order to illustrate one exemplary use for compatible clock signals.

In the illustrated embodiment, analog audio inputs arrive at DSP 210 via analog to digital converters (ADC's) 320 and digital audio inputs arrive directly at DSP 310. The various inputs may have various different frequencies, which are often incompatible. Similarly, audio outputs may be required at different frequencies, which may be incompatible with each other, with DSP clocks, and/or with audio inputs. In the illustrated embodiment, DSP 310 is configured to generate analog audio outputs using digital to analog converters (DAC's) 350. ADC's 320 and DAC's 350 may be clocked using the audio oversampling clock 230 of FIG. 2, for example.

Traditionally, asynchronous sample rate converters (ASRC's) have been used to reconcile incompatible clock frequencies. In the illustrated embodiment, potential locations for ASRC's 360a-c are shown using dashed lines. However, using embodiments described herein, one or more ASRC's may be eliminated. For example, referring to the embodiment of system 100 of FIG. 1, an audio input or output may be used as reference clock signal 155, resulting in any clock signals generated from PLL output clock signal 145 being compatible with the audio input or output and eliminating a need for one or more of ASRC's 360. In some embodiments, multiple PLL's may be implemented (e.g., multiple instances of system 100), in order to eliminate a need for still other ASRC's. Speaking generally, various embodiments may allow audio signals that are sampled at different frequencies to be provided directly from ADC's 320 to DSP 310 and/or from DSP 310 to audio outputs without intervening ASRC's.

Figure 4:
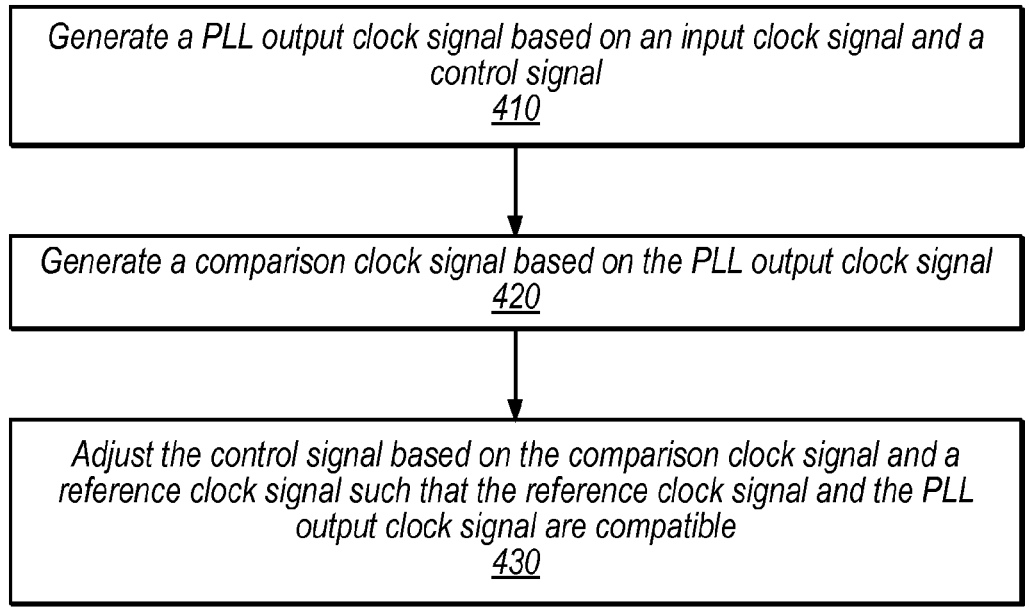
FIG. 4 is a flow diagram illustrating one embodiment of a method for generating clock signals.

Referring now to FIG. 4, a flow diagram illustrating one exemplary embodiment of a method 400 for generating compatible clock signals is shown. The method shown in FIG. 4 may be used in conjunction with any of the devices, elements, or components disclosed herein, among other devices. In various embodiments, some of the method elements shown may be performed concurrently, in a different order than shown, or may be omitted. Additional method elements may also be performed as desired. Flow begins at block 410.

At block 410, a PLL unit generates a PLL output clock signal based on an input clock signal and a control signal. In one embodiment, the control signal indicates a divide ratio for the PLL unit. In some embodiments, a crystal oscillator is configured to provide the input clock signal. In some embodiments, the PLL output clock signal is a fractional multiple of the input clock signal (e.g., when the PLL unit is a fractional-N PLL). Flow proceeds to block 420.

At block 420, a comparison clock signal is generated based on the PLL output clock signal. In one embodiment, a variable fractional divide unit is configured to divide the PLL output clock signal to generate the comparison clock signal. The comparison clock signal may be directly compatible and/or having a matching frequency with a reference clock signal when the system is performing correctly. Flow proceeds to block 430.

At block 430, a rate estimator adjusts the control signal based on the comparison clock signal and a reference clock signal. The rate estimator adjusts the control signal such that the reference clock signal and the PLL output clock signal are compatible.

In one embodiment, the steps of method 400 are performed concurrently. During an initial time period, the relationships between the various clock signals may not be met. For example, the PLL output clock signal and the reference clock signal may not be compatible immediately. However, once the inner and outer loops of the system have locked, the relationships between various clock signals may be maintained. Flow ends at block 430.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus configured to receive an input clock signal and a reference clock signal, the apparatus comprising:
   a rate estimation unit;
   a phase-locked loop (PLL) unit configured to generate, using a control signal from the rate estimation unit and the input clock signal, a PLL output clock signal; and
   a frequency adjustment unit configured to generate a comparison clock signal based on the PLL output clock signal, wherein the comparison clock signal has a different frequency than the PLL output clock signal;
   wherein the rate estimation unit is configured to adjust the control signal, based on the comparison clock signal and the reference clock signal, such that the PLL output clock signal and the reference clock signal are compatible.

2. The apparatus of claim 1, wherein the PLL unit includes a fractional-N phase-locked loop and wherein the control signal is a divide ratio control signal.

3. The apparatus of claim 2, wherein the apparatus is configured to maintain a current PLL divide ratio in response to detecting a removal of the reference clock signal.

4. The apparatus of claim 1, wherein the rate estimation unit is further configured to adjust the control signal such that the reference clock signal and the comparison clock signal have matching frequencies.

5. The apparatus of claim 1, wherein the rate estimation unit is configured to adjust the control signal such that the PLL output clock signal and the reference clock signal are directly compatible.

6. The apparatus of claim 1, further comprising a divider unit configured to generate an audio oversampling clock signal based on the PLL output clock signal, wherein the audio oversampling clock signal is usable by a digital to analog converter (DAC) or an analog to digital converter (ADC) without asynchronous sample rate conversion.

7. The apparatus of claim 1, wherein the reference clock signal is an audio sampling clock or is directly compatible with an audio sampling clock.

8. The apparatus of claim 1,
   wherein the rate estimation unit is further configured to adjust the control signal such that the reference clock signal and the comparison clock signal are directly compatible; and
   wherein the input clock signal and the reference clock signal have different frequencies.

9. The apparatus of claim 1, further comprising a delta-sigma modulator unit, wherein the delta-sigma modulator unit is configured to modulate the control signal and send the modulated control signal to the PLL unit.

10. The apparatus of claim 1,
    wherein the comparison clock signal is generated based on a main clock signal, wherein the main clock signal is generated based on the PLL output clock; and
    wherein the apparatus is configured to reduce a frequency of the main clock signal while maintaining a frequency of the comparison clock signal.

11. The apparatus of claim 1, wherein the rate estimation unit is configured to adjust the control signal based on relative positions of an insert pointer and a remove pointer that reference a storage array.

12. The apparatus of claim 1, wherein the PLL unit includes a variable divider configured to generate a phase comparison clock signal based on the PLL output clock signal and provide the phase comparison clock signal to a phase detector, and wherein the apparatus is configured provide the input clock signal to the phase detector.

13. A method, comprising:
    generating, based on a control signal and an input clock signal, a PLL output clock signal;
    generating a comparison clock signal based on the PLL output clock signal, wherein the comparison clock signal and the PLL output clock signal have different frequencies; and
    adjusting the control signal based on the comparison clock signal and a reference clock signal such that the reference clock signal and the comparison clock signal are directly compatible and such that the reference clock signal and the PLL output clock signal are compatible.

14. The method of claim 13, wherein the generating the PLL output clock signal includes adjusting a divide ratio of a PLL unit based on the control signal.

15. The method of claim 13, further comprising adjusting the control signal such that the comparison clock signal and the reference clock signal are directly compatible.

16. The method of claim 13, further comprising:
    maintaining the control signal at a particular value in response to detecting removal of the reference clock signal.

17. The method of claim 13, further comprising:
    reducing a frequency of a main clock signal generated based on the PLL output clock signal; and
    maintaining a frequency of the comparison clock signal;
    wherein the comparison clock signal is generated based on the main clock signal.

18. A non-transitory computer-readable storage medium having instructions stored thereon that are executable by a computing device to perform operations comprising:
    comparing a frequency of a reference clock signal and a frequency of a comparison clock signal; and generating a control signal based on the comparing, wherein the control signal is usable to adjust a divide ratio of a phase-locked loop (PLL) unit, wherein the comparison clock signal is generated based on an output clock signal of the PLL unit and has a different frequency than the output clock signal, and wherein the generating the control signal results in compatibility between the output clock signal and the reference clock signal.

19. The non-transitory computer-readable storage medium of claim 18, wherein the comparing includes determining relative positions over time of insert and remove pointers for a storage array.

20. The non-transitory computer-readable storage medium of claim 18, wherein the operations further comprise:
   modulating the control signal.

21. The non-transitory computer-readable storage medium of claim 18, wherein the operations further comprise:
   maintaining a current control signal in response to detecting removal of the reference clock signal.

* * * * *